(12) United States Patent
Hoeks

(10) Patent No.: US 7,403,865 B2
(45) Date of Patent: Jul. 22, 2008

(54) SYSTEM AND METHOD FOR FAULT INDICATION ON A SUBSTRATE IN MASKLESS APPLICATIONS

(75) Inventor: Martinus Hoeks, Breugels (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/022,926

(22) Filed: Dec. 28, 2004

(65) Prior Publication Data

US 2006/0142967 A1  Jun. 29, 2006

(51) Int. Cl.
*G01R 31/00* (2006.01)
*G01F 19/00* (2006.01)
*G01B 5/30* (2006.01)

(52) U.S. Cl. ........................ 702/117; 702/35

(58) Field of Classification Search ............... 702/33, 702/35, 36, 40, 94, 95, 117, 119, 120, 150; 250/491.1, 492.1, 492.2, 492.22, 492.23
See application file for complete search history.

(56) References Cited

U.S. PATENT DOCUMENTS

| | | | |
|---|---|---|---|
| 3,875,416 A * | 4/1975 | Spicer | 250/492.1 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,020,582 B1 * | 3/2006 | Dicosola et al. | 702/185 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0206857 A1 * | 9/2005 | Yamada | 353/94 |
| 2006/0109576 A1 * | 5/2006 | Baba-Ali | 359/879 |

FOREIGN PATENT DOCUMENTS

| | | | |
|---|---|---|---|
| EP | 1 677 155 | * | 7/2006 |
| WO | WO 98/33096 | | 7/1998 |
| WO | WO 98/38597 | | 9/1998 |

OTHER PUBLICATIONS

European Search Report for Appl. No. 05257757.4 2222; dated Mar. 27, 2006; 3 pages.

* cited by examiner

*Primary Examiner*—Michael P Nghiem
(74) *Attorney, Agent, or Firm*—Sterne, Kessler, Goldstein & Fox PLLC

(57) ABSTRACT

A method and system for fault indication on a substrate. A method of the present invention includes the following steps. It is determined whether data includes at least one suspicious bit. A pattern generator is controlled with the data. A beam of radiation is patterned using the pattern generator. Features are projected by the patterned beam of radiation onto a target portion of a substrate. One or more markers are projected by the patterned beam of radiation onto the substrate indicating the target portions that correspond with the at least one suspicious bit.

14 Claims, 3 Drawing Sheets

SYSTEM AND METHOD FOR FAULT INDICATION ON A SUBSTRATE IN MASKLESS APPLICATIONS

BACKGROUND OF THE INVENTION

1. Field of the Invention

The present invention is directed to a light patterning device and a method of using the same.

2. Background Art

A patterning device is used to pattern incoming light. A static patterning device can include reticles or masks. A dynamic patterning device can include an array of individually controllable elements that generate a pattern through receipt of analog or digital signals. The analog or digital signals are transmitted through a data path. The algorithm used to control the dynamic patterning device, so that its individually controllable elements are in a proper state to form a desired pattern, is called a rasterization algorithm or optical rasterization algorithm. Example environments for use of the patterning device can be, but are not limited to, a lithographic apparatus, a projector, a projection display apparatus, or the like.

Large amounts of data are manipulated by and transported through the data path to control the array of individually controllable elements of a dynamic patterning device, which makes it probable that bit errors will result somewhere in the data path. These bit errors could lead to errors in the patterns exposed by the patterned light.

Therefore, what is needed is a method and system for detecting if a bit error exists in the data path. If a bit error is detected, it should be determined whether the bit error has led to an error in an exposed pattern.

BRIEF SUMMARY OF THE INVENTION

According to an aspect of the present invention there is provided a method, including the following steps. It is determined whether data includes at least one suspicious bit. The data is used to control a pattern generator. The pattern generator patterns a beam of radiation. Features are projected by the patterned beam of radiation onto a target portion of a substrate. One or more markers are projected by the patterned beam onto the substrate indicating a position of a possible pattern error caused by the one or more suspicious bits.

According to another aspect of the present invention there is provided a system, including a control module, a pattern generator, and a projection system. The control module detects whether data includes at least one suspicious bit and generates suspicious bit information. The pattern generator patterns a beam of radiation. The data and the suspicious bit information are used to control the pattern generator. The projection system projects the patterned beam of radiation onto a target portion of a substrate.

Further embodiments, features, and advantages of the present invention, as well as the structure and operation of the various embodiments of the present invention, are described in detail below with reference to the accompanying drawings.

It is to be appreciated that the Summary represents one or more exemplary embodiments and/or examples, but not all embodiments and/or examples of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

I. Overview

Figure 1:
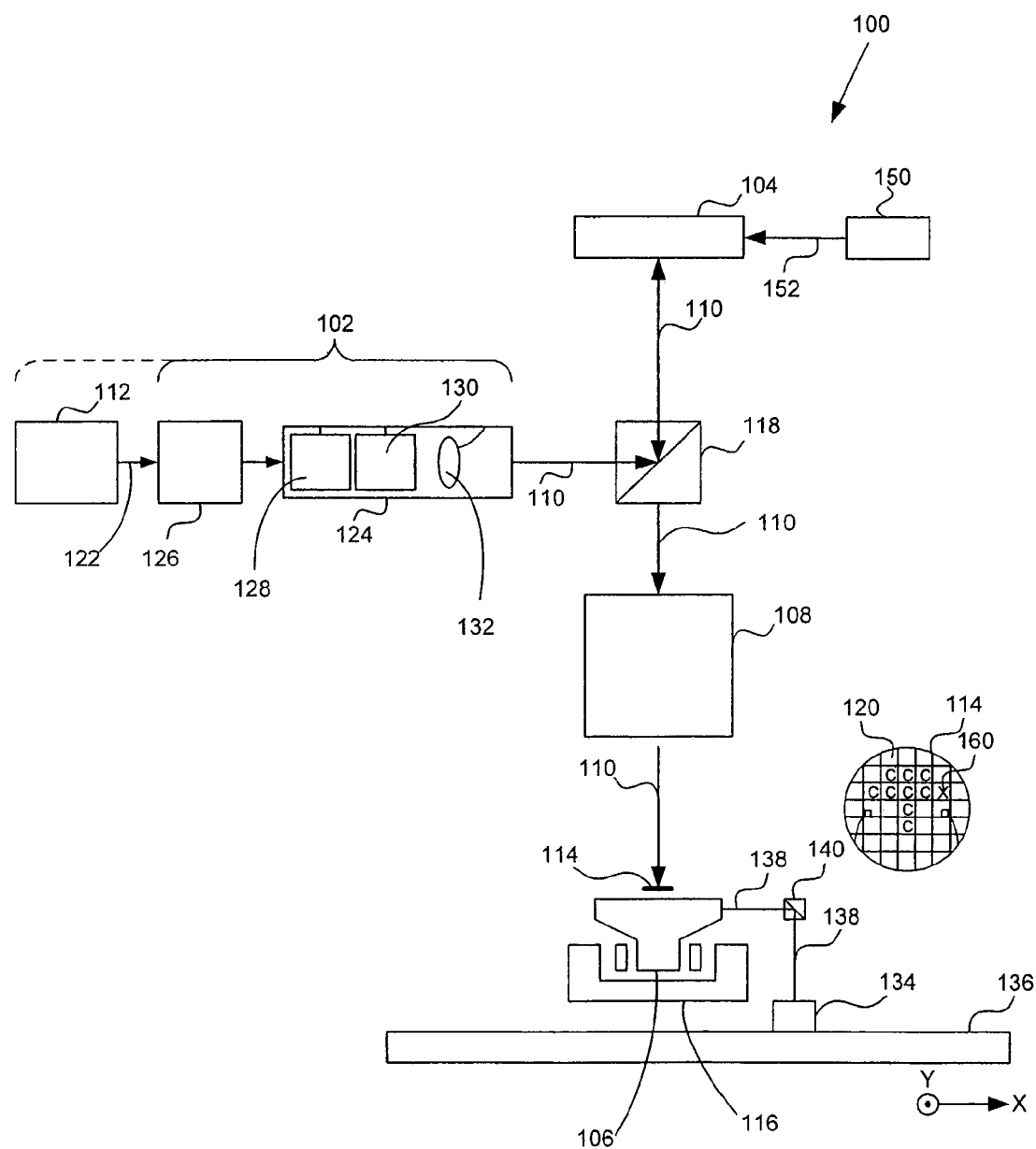
FIG. 1 depicts an exemplary lithographic apparatus, in accordance with an embodiment of the present invention.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc.

A method and system of the present invention can be used to determine if a suspicious bit in a data path has lead to an error in an exposed pattern on a substrate. Example advantages of aspects of the present invention include higher yield at the customer, easier diagnosis, and higher customer confidence in the data path.

The Detailed Description is divided into six subsections. In subsection II, terminology used in this document is disclosed. Subsection III describes an exemplary lithographic apparatus, in accordance with an embodiment of the present invention. Subsection IV describes an exemplary method, in accordance with an embodiment of the present invention. Subsection V includes a discussion of example advantages of embodiments of the present invention. Lastly, in subsection VI, concluding remarks are discussed.

II. Terminology

The use of the terms "wafer" or "die" herein can be considered as synonymous with the more general terms "substrate" or "target portion", respectively. The substrate referred to herein can be processed, before or after exposure, in, for example, a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g., having a wavelength in the range of 5-20 nm), as well as particle beams, such as ion beams or electron beams.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

III. An Exemplary Lithographic Apparatus

FIG. 1 schematically depicts a lithographic projection apparatus 100 according to an embodiment of the present invention. Apparatus 100 includes a radiation system 102, a pattern generator 104, a projection system 108 ("lens"), and an object table 106 (e.g., a substrate table). An overview of the operation of lithographic apparatus 100 follows. Then alternative embodiments of lithographic apparatus 100 are discussed. After the overview and alternative embodiments of lithographic apparatus 100, details and alternative embodiments of each of the elements in apparatus 100 are described.

A. Overview and Alternative Embodiments

Radiation system 102 can be used for supplying a beam 110 of radiation (e.g., UV radiation). In this particular case, radiation system 102 also comprises a radiation source 112. Beam 110 subsequently intercepts the pattern generator 104 after being directed using beam splitter 118. Pattern generator 104 (e.g., a programmable mirror array) can be used for applying a pattern to beam 110. Having been reflected by pattern generator 104, beam 110 passes through projection system 108, which focuses beam 110 onto a target portion 120 of a substrate 114. Substrate 114 is supported by object table 106, which is described in more detail below.

In an alternative embodiment (not shown), lithographic apparatus 100 can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

Lithographic apparatus 100 can also be of a type wherein the substrate is immersed in a liquid (not shown) having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, lithographic apparatus 100 can be provided with a fluid processing cell to allow interactions between a fluid and irradiated parts of the substrate (e.g., to selectively attach chemicals to the substrate or to selectively modify the surface structure of the substrate).

Although lithography apparatus 100 according to an embodiment of the present invention is herein described as being for exposing a resist on a substrate, it will be appreciated that the invention is not limited to this use and apparatus 100 can be used to project a patterned beam 110 for use in resistless lithography.

B. Radiation System

Radiation system 102 can include a source 112, a conditioning device 126, and an illumination source (illuminator) 124. In addition, illuminator 124 will generally include various other components, such as an integrator 130 and a condenser 132.

Source 112 (e.g., an excimer laser) can produce a beam of radiation 122. Beam 122 is fed into illumination source (illuminator) 124, either directly or after having traversed conditioning device 126, such as a beam expander, for example. Adjusting device 128 can be used for setting the outer and/or inner radial extent (commonly referred to as σ-outer and σ-inner, respectively) of the intensity distribution in beam 122. In this way, beam 110 impinging on the pattern generator 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

The illumination source can also encompass various types of optical components, including refractive, reflective, and catadioptric optical components for directing, shaping, or controlling the beam of radiation, and such components can also be referred to below, collectively or singularly, as a "lens."

C. Pattern Generator

Pattern generator 104 includes SLMs that can be regarded as replacing a conventional reticle. In addition to the SLM, pattern generator 104 may comprise driving electronics for the SLM pixels and a data path. Input image data is transformed into a suitable format and fed to the SLM by control module 150 (described in more detail below), via the data path. The drive electronics addresses each SLM pixel in sequence as the SLM pattern is updated, i.e., each new SLM image frame can be loaded by normal matrix addressing. The frame rate, i.e., the time required to load each new frame onto the SLM, is a determining factor on apparatus throughput.

Current technology may not allow construction of a single SLM that can provide the massive array of pixels necessary to give the throughput required in many applications. Thus, typically a multiple SLM array (MSA) is used in parallel to provide the number of pixels needed. For example, the pixels from different SLMs of the MSA are "stitched" together to form a cohesive image on the substrate. This can be done using motion control and gray scaling techniques. In the following description, for most instances, a reference to an SLM can also be interpreted as including an MSA.

In general, the position of pattern generator 104 can be fixed relative to projection system 108. However, in an alternative arrangement, pattern generator 104 can be connected to a positioning device (not shown) for accurately positioning it with respect to projection system 108. As depicted in FIG. 1, pattern generator 104 is of a reflective type, e.g., a programmable mirror array.

It will be appreciated that, as an alternative, a filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

Examples of other types of pattern generators can include, but are not limited to, tilting reflective devices, pistoning reflective devices, graytoning transmissive devices and graytoning reflective devices D. Control Module Control module 150 comprises the data path, and will typically include a storing device for storing a "mask file" and a rasterizer. The storing device contains the entire image to be printed on the substrate. The rasterizer converts appropriate portions of the image for loading on to the SLM into a bit map of SLM pixel values representing the pattern required to transfer the desired image to the substrate. Control module 150 will typically also comprise one or more frame buffers and other conventional components necessary for matrix addressing of the SLM each time a new SLM frame is loaded. Appropriate image digitization and SLM drive electronics will become apparent to one of skill in the relevant art. For instance, control module 150 can be very similar to a bit map based mask-writer, but with appropriate matrix addressing drive circuitry for addressing individual SLM pixels of the particular type of SLM used.

As mentioned above, control module 150 supplies data to pattern generator 104 that controls the actuation state (e.g., voltage or tilt angle) of the individual SLMs of pattern generator 104. The ability to deliver data at a sufficiently high rate is therefore an important consideration in attaining desired substrate scan speeds (described below), and thus production rates. For instance, in the case of flat panel display (FPD) production the apparatus typically operates in pulse scan mode with lasers pulsing at 50 KHz with 10/20 nsec pulse duration. The high frequency is used to provide acceptable throughput because of the large substrate areas that must be scanned to produce FPDs. To load an SLM frame between pulses at this frequency can require data transfer rates of the order of about 10 to 100 Gpixels/sec or more. Very complicated and expensive data handling and driver systems are required to handle such high data transfer rates. In addition, with such high data transfer rates the chance of data errors occurring is proportionately non-negligible.

Unless otherwise specified, through the rest of this description, the term "data transfer requirement" is to be understood to mean the amount of data that must be transferred to the SLM for updating the image frame.

Figure 2:
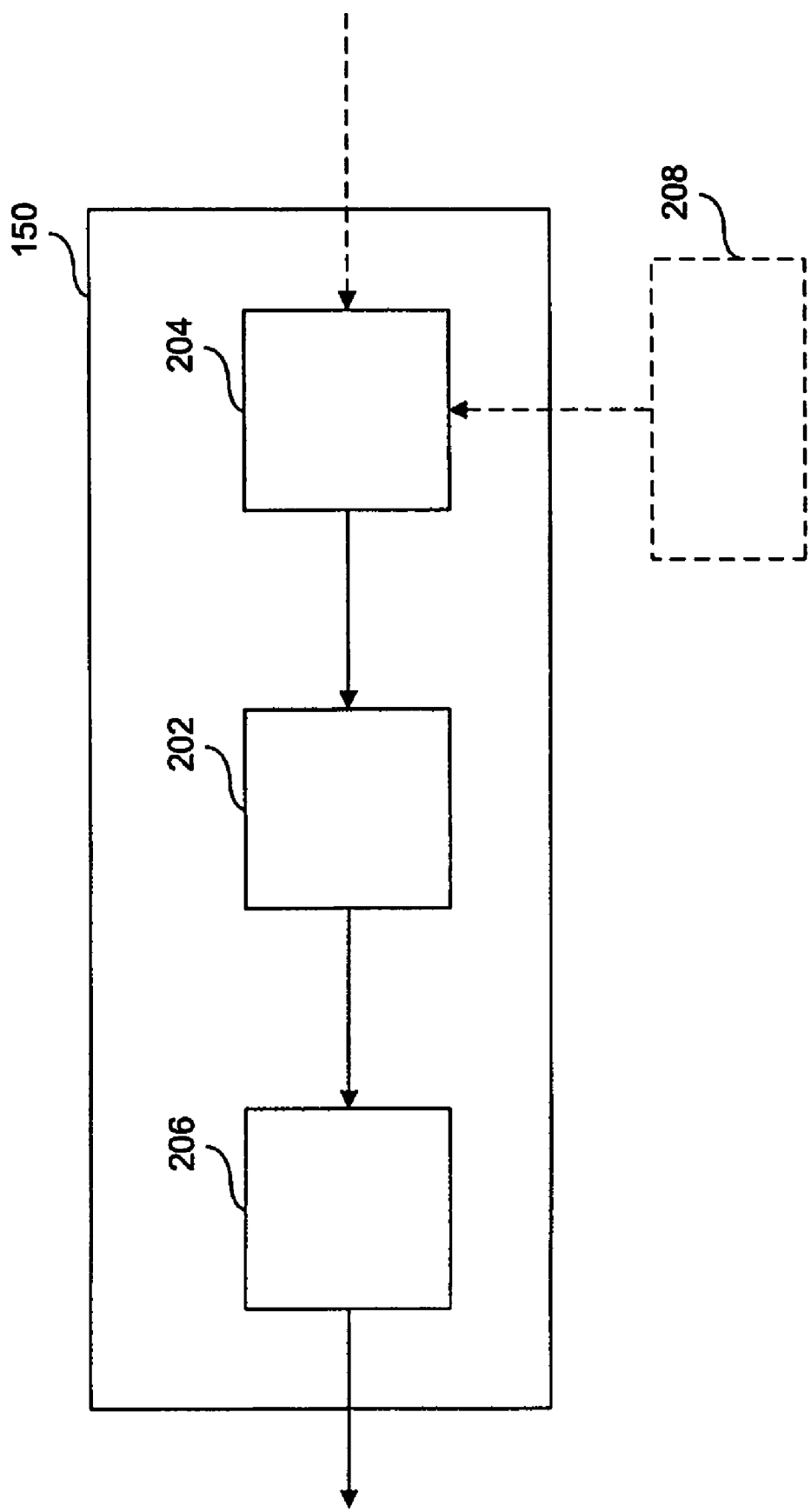
FIG. 2 depicts an exemplary control module, in accordance with an embodiment of the present invention.

FIG. 2 depicts an exemplary embodiment of control module 150. In this embodiment, control module 150 includes an input device (optional) 208, a detector 204, a memory 202 (optional), and a rasterizer 206.

Input device 208 can be used to input an error criterion. For example, input device 208 can include a user interface so that a system operator can define an error criterion.

Whether the error criterion is input manually or not, detector 204 receives and checks if the the error criterion is met to determine if the data includes one or more suspicious bits, i.e., a bit or a combination of bits that may potentially lead to an error in an exposed image. Typical mechanisms to implement detectors for bit errors in a data stream or block of data can include, but are not limited to, a cyclic redundancy check (CRC), a check sum or a parity bit. It is to be appreciated that a suspicious bit in the data path does not necessarily correspond with an error occurring in an exposed image. That is, inspection of the exposed image (assisted by the printed markers) could prove that the suspicious bit was not severe and did not deteriorate the projected image to an unacceptable level. If a suspicious bit is detected, detector 204 can be used to generate suspicious bit information.

Memory 202 can be used to store suspicious bit information. However, information about the suspicious bits need not be stored in memory. That is, the suspicious bit information can be associated as meta-information with the data, for example, and sent straight to rasterizer 206.

Rasterizer 206 sends the data and the suspicious bit information to pattern generator 104. The data and suspicious bit information are used to control the individually controllable elements of pattern generator 104. In particular, the data can correspond with a pattern to be projected onto substrate 114 and the suspicious bit information can correspond with one or more markers that are projected on substrate 114 to indicate potential errors in a pattern exposed thereon.

It is to be appreciated that FIG. 2 is shown for illustrative purposes, and not limitation. A person skilled in the relevant art will appreciate that detector 204 and rasterizer 206 could be arranged differently in control module 150. For example, in alternative embodiments, detector 204 and rasterizer 206 can work serially (as shown in FIG. 2), contemporaneously, or in some combination thereof. It is to be appreciated that these alternative embodiments are contemplated within the scope of the present invention.

E. Projection System

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the pattern generator 104 onto substrate 114. Alternatively, projection system 108 can project images of secondary sources for which the elements of the pattern generator 104 act as shutters. Projection system 108 can also comprise a micro lens array (MLA) to form the secondary sources and to project microspots onto substrate 114.

F. Object Table

Object table 106 can be provided with a substrate holder (not specifically shown) for holding a substrate 114 (e.g., a resist coated silicon wafer, a projection system display, a semiconductor substrate, a glass substrate, a polymer substrate or a projection television display device). In addition, object table 106 can be connected to a positioning device 116 for accurately positioning substrate 114 with respect to projection system 108.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the pattern generator 104 can be used to accurately correct the position of the pattern generator 104 with respect to the path of beam 110, e.g., during a scan. In general, movement of object table 106 is realized with the aid of a long-stroke module (course positioning) and a short-stroke module (fine positioning), that are not explicitly depicted in FIG. 1. A similar system can also be used to position pattern generator 104. It will be appreciated that beam 110 can alternatively/additionally be moveable, while object table 106 and/or the pattern generator 104 can have a fixed position to provide the required relative movement.

In an alternative configuration of the embodiment, object table 106 can be fixed, with substrate 114 being moveable over object table 106. Where this is done, object table 106 is provided with a multitude of openings on a flat uppermost surface, gas being fed through the openings to provide a gas cushion that is capable of supporting substrate 114. This is conventionally referred to as an air bearing arrangement. Substrate 114 is moved over object table 106 using one or more actuators (not shown), that are capable of accurately positioning substrate 114 with respect to the path of beam 110. Alternatively, substrate 114 can be moved over object table 106 by selectively starting and stopping the passage of gas through the openings.

In an example, lithography apparatus 100 can include an inspection device (not specifically shown) that inspects an image exposed on substrate 114. In an alternative example, substrate 114 can be inspected manually.

It should be appreciated that where pre-biasing of features, optical proximity correction features, phase variation techniques and multiple exposure techniques are used, for example, the pattern "displayed" on pattern generator 104 can differ substantially from the pattern eventually transferred to a layer of or on the substrate. Similarly, the pattern eventually generated on the substrate can not correspond to the pattern formed at any one instant on pattern generator 104. This can be the case in an arrangement in which the eventual pattern formed on each part of the substrate is built up over a given period of time or a given number of exposures during which the pattern on pattern generator 104 and/or the relative position of the substrate changes.

In addition, suspicious bit information can be used to pattern the beam in such a manner that the projected beam projects one or more markers 160 onto the substrate. For example, the patterned beam can include a pattern (associated with an image to be exposed) and one or more markers 160 (associated with suspicious bit information). The one or more markers 160 can be projected by projection system 108 proximate portions of substrate 114 where an error is suspected based on the suspicious bit information. That is, the one or more markers 160 can appear in the pattern that is associated with the image to be exposed or on the substrate border outside the pattern that is associated with the image to be exposed.

G. Exemplary Modes of Operation

The depicted apparatus 100 can be used in four preferred modes:

1. Step mode: the entire pattern on pattern generator 104 is projected in one go (i.e., a single "flash") onto a target portion 120. Object table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned beam 110 is caused to scan over the array of individually controllable elements 104. Concurrently, object table 106 is simultaneously moved in the same or opposite direction at a speed V=Mv, in that M is the magnification of projection system 108. In this manner, a relatively large target portion 120 can be exposed, without having to compromise on resolution.

3. Pulse mode: pattern generator 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on pattern generator 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until substrate 114 has been exposed line by line.

4. Continuous scan mode: essentially the same as pulse mode except that a substantially constant radiation system 102 is used and the pattern on pattern generator 104 is updated as patterned beam 110 scans across substrate 114 and exposes it.

Regardless of the operation mode used, the pattern generated by the SLM or MSA of pattern generator 104 (i.e., the "on" or "off" state of each of the individually controllable elements—hereinafter referred to as "SLM pixels") are periodically updated to transfer the desired image to the substrate. For example, in step mode and scan mode, the pattern can be updated between each step or scan operation. In pulse mode, the SLM pattern is updated as required between pulses of the radiation system. In continuous scan mode, the SLM pattern is updated as the beam scans across the substrate.

Combinations and/or variations on the above described modes of use or entirely different modes of use can also be employed.

IV. Exemplary Method

Figure 3:
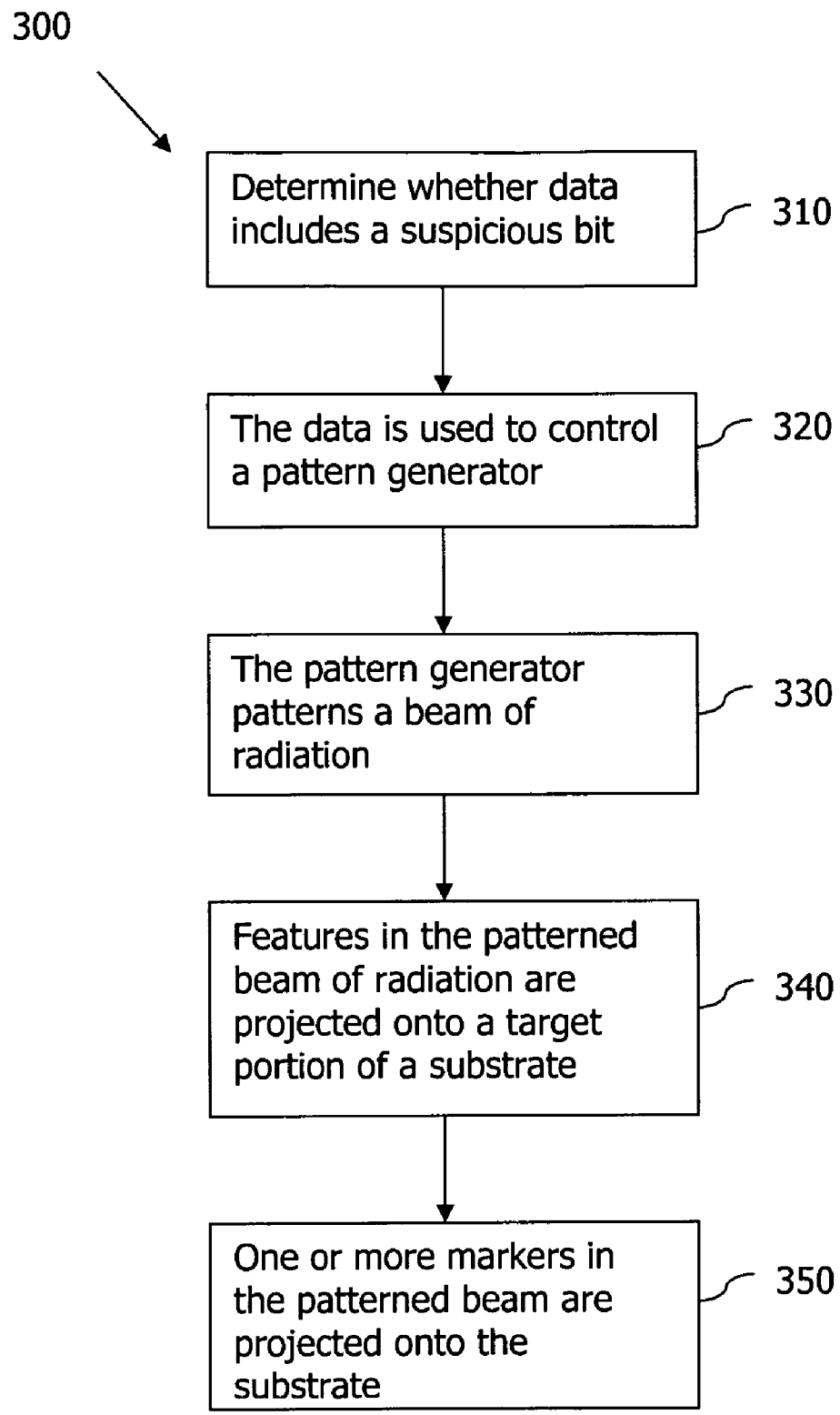
FIG. 3 illustrates a flowchart of a method, in accordance with an embodiment of the present invention.

FIG. 3 depicts a flowchart 300 that illustrates an exemplary method, in accordance with an embodiment of the present invention. Flowchart 300 begins at step 310, in which it is determined whether data includes at least one suspicious bit. For example, detector 204 can compare a data set to an error criterion to determine if a suspicious bit or a combination of suspicious bits is present in the data. An example error criterion can include, but is not limited to, the following: (i) at least one suspicious bit does not exist if a least significant bit of a digital binary number is a 1; and (ii) at least one suspicious bit exists if a most significant bit of a digital binary number is a 1.

In an example, the error criterion can be manually input, e.g., by input device 208. In another example, the error criterion is compared to each bit in the data. In a further example, detecting a suspicious bit can include the use of an error detection algorithm. Example error detection algorithms can include, but are not limited to, a parity check algorithm, an error-code detection algorithm (e.g., Cyclic Redundancy Check), combinations thereof, or some other error detection algorithm.

In step 320, the data is used to control a pattern generator. For example, rasterizer 206 can send the data to pattern generator 104. In one example, if a suspicious bit is detected in the data, suspicious bit information can be associated and sent with the data. In another example, the suspicious bit information is stored in memory (e.g., memory 202) before being sent with the data to pattern generator 104.

In step 330, the pattern generator patterns a beam of radiation. For example, pattern generator 104 can pattern the beam of radiation, as described above.

In step 340, features in the patterned beam of radiation are projected onto a target portion of a substrate. For example, projection system 108 can project the patterned beam onto a portion of substrate 114. Examples of the substrate can include, but are not limited to, a semiconductor substrate, a glass substrate, a flat panel display substrate, and a polymer substrate, or some other substrate used in maskless applications.

In step 350, one or more markers in the patterned beam are projected onto the substrate proximate respective ones of the target portions when the suspicious bit is determined in step 310. For example, in flat panel display (FPD) devices it is possible to print the marker(s) next to portions of the panels of the FPD device, so that the markers act as coordinates corresponding with the suspicious bit(s). For instance, a marker at the X coordinate and a marker at the Y coordinate, inside or outside of the pattern can be printed on the panel; a single marker inside the pattern is also possible.

An area of the substrate that has a marker can be inspected to determine if the features associated with the marker are within predetermined specifications. Example features that can be inspected can include, but are not limited to, placement of features, image contrast, image log slope, critical dimension uniformity, out of focus behavior, or some other feature.

V. Example Advantages

Example advantages of the present invention can include, but are not limited to the following.

Higher yield at the customer, since products that are not within predetermined specifications due to bit errors can be identified, and thus not sent to the customer; in addition, if multiple products (identical or not) are printed on the same substrate, one can discriminate between good and bad products. Good products can be shipped. Without the present invention a customer might have to discard the whole substrate.

Easier diagnostics, since one or more markers are printed on the substrate to indicate potential problem areas.

Higher customer confidence in the data path, since bit errors in the data path can be detected and identified.

VI. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A method for indicating fault on a substrate, comprising:
   (a) prior to forming one or more portions of a pattern on the substrate, determining whether data corresponding to the one or more portions of the pattern include at least one suspicious bit;
   (b) generating suspicious bit information corresponding to the at least one suspicious bit;
   (c) controlling a pattern generator based on the data and the suspicious bit information;
   (d) patterning a beam of radiation using the pattern generator; and
   (e) projecting the patterned beam onto the substrate to form the one or more portions of the pattern and one or more markers thereon, wherein the one or more markers mark one or more potential faults in the one or more portions of the pattern corresponding to the at least one suspicious bit.

2. The method of claim 1, wherein step (a) comprises:
using an error detection algorithm to determine whether the data includes at least one suspicious bit.

3. The method of claim 1, wherein step (a) comprises:
comparing an error criterion to the data.

4. The method of claim 3, wherein the error criterion comprises:
determining that at least one suspicious bit does not exist if one or more least significant bits of a digital binary number is a 1; and
determining that at least one suspicious bit exists if one or more most significant bits of the digital binary number is a 1.

5. The method of claim 3, further comprising:
manually inputting the error criterion.

6. The method of claim 1,
wherein the substrate comprises a flat panel display, and wherein the one or more markers act as coordinates of at least one suspicious portion of the flat panel display corresponding to the at least one suspicious bit.

7. The method of claim 1, further comprising:
(f) inspecting areas of the substrate that include the one or more markers to determine if the one or more portions of the pattern associated with the one or more markers are within predetermined specifications.

8. The method of claim 1, wherein the substrate comprises at least one of a semiconductor substrate, a flat panel display substrate, and a polymer substrate.

9. A system, comprising:
a control module that (i) detects whether data corresponding to one or more portions of a pattern include at least one suspicious bit, prior to forming the one or more portions of the pattern on a substrate, and (ii) generates suspicious bit information corresponding to the at least one suspicious bit;
a pattern generator that patterns a beam of radiation, wherein the data and the suspicious bit information are used to control the pattern generator; and
a projection system that projects the patterned beam of radiation onto a target portion of the substrate to form the one or more portions of the pattern and one or more markers thereon, wherein the one or more markers mark one or more potential faults in the one or more portions of the pattern corresponding to the at least one suspicious bit detected by the control module.

10. The system of claim 9, further comprising:
a memory that stores the data and the suspicious bit information relating to the at least one suspicious bit; and
a rasterizer that sends the data and the suspicious bit information to the pattern generator.

11. The system of claim 9, further comprising:
an input device for inputting an error criterion; and
a detector that compares the error criterion to the data to determine if at least one suspicious bit exists in the data.

12. The system of claim 9, wherein the one or more markers act as a coordinate or coordinates on the substrate of the at least one suspicious bit.

13. The system of claim 9, further comprising:
an inspection system that inspects potential problem areas of the substrate marked by the one or more markers to determine if the one or more portions of the pattern on the substrate associated with the one or more markers are within predetermined specifications.

14. The system of claim 9, wherein the substrate comprises at least one of a semiconductor substrate, a glass substrate, and a polymer substrate.

* * * * *